United States Patent
Nishidono et al.

(10) Patent No.: US 11,244,878 B2
(45) Date of Patent: Feb. 8, 2022

(54) SEMICONDUCTOR CHIP-ENCAPSULATING RESIN COMPOSITION CONTAINING EPOXY RESIN, AND SEMICONDUCTOR PACKAGE INCLUDING A CURED PRODUCT OF THE SEMICONDUCTOR-CHIP-ENCAPSULATING RESIN COMPOSITION

(71) Applicant: PANASONIC INTELLECTUAL PROPERTY MANAGEMENT CO., LTD., Osaka (JP)

(72) Inventors: Kyoko Nishidono, Osaka (JP);
Takahiro Akashi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/761,668

(22) PCT Filed: Oct. 31, 2018

(86) PCT No.: PCT/JP2018/040473
§ 371 (c)(1),
(2) Date: May 5, 2020

(87) PCT Pub. No.: WO2019/098026
PCT Pub. Date: May 23, 2019

(65) Prior Publication Data
US 2021/0183719 A1     Jun. 17, 2021

(30) Foreign Application Priority Data

Nov. 14, 2017    (JP) .............................. JP2017-219228
Jan. 31, 2018    (JP) .............................. JP2018-015698

(51) Int. Cl.
*H01L 23/29*      (2006.01)
*H01L 21/00*      (2006.01)
(Continued)

(52) U.S. Cl.
CPC ........ *H01L 23/295* (2013.01); *H01L 23/3107* (2013.01); *H01L 23/3121* (2013.01);
(Continued)

(58) Field of Classification Search
CPC . H01L 23/295; H01L 23/3121; H01L 23/544; H01L 23/3107; H01L 33/52;
(Continued)

(56) References Cited

U.S. PATENT DOCUMENTS

2012/0170277 A1*   7/2012   Tamura ................... G02B 1/041
                                                                                      362/296.02
2016/0111611 A1*   4/2016   Yoshida ................... C08K 5/09
                                                                                     257/98
(Continued)

FOREIGN PATENT DOCUMENTS

JP          04-072360       3/1992
JP          09-208666       8/1997
(Continued)

OTHER PUBLICATIONS

Official Communication issued in International Patent Application No. PCT/JP2018/040473, dated Jan. 22, 2019, along with English Translation.

*Primary Examiner* — Alonzo Chambliss
(74) *Attorney, Agent, or Firm* — Greenblum & Bernstein, P.L.C.

(57) ABSTRACT

A semiconductor-chip-encapsulating resin composition according to the present disclosure contains: an epoxy resin; a curing agent; and a low-valent titanium oxide, of which a titanium atom has an oxidation number less than +IV. A (Continued)

semiconductor package according to the present disclosure includes: a semiconductor chip; and an encapsulation resin which covers the semiconductor chip and which is a cured product of the semiconductor-chip-encapsulating resin composition.

9 Claims, 2 Drawing Sheets

(51) Int. Cl.
*H01L 23/31* (2006.01)
*H01L 23/544* (2006.01)
*H01L 31/048* (2014.01)
*H01L 51/52* (2006.01)
*H01L 33/56* (2010.01)
*H01L 33/52* (2010.01)

(52) U.S. Cl.
CPC ........ *H01L 23/544* (2013.01); *H01L 31/0481* (2013.01); *H01L 33/52* (2013.01); *H01L 33/56* (2013.01); *H01L 51/5253* (2013.01); *H01L 2223/54486* (2013.01); *H01L 2924/181* (2013.01)

(58) Field of Classification Search
CPC . H01L 33/56; H01L 51/5253; H01L 31/0481; H01L 2924/181
See application file for complete search history.

(56) References Cited

U.S. PATENT DOCUMENTS

2016/0233396 A1* 8/2016 Ota ................. C09K 11/617
2016/0245996 A1* 8/2016 Nomura ............ H01L 25/167

FOREIGN PATENT DOCUMENTS

| JP | 09-208673 | 8/1997 |
| JP | 2002-363379 | 12/2002 |
| JP | 2006-278959 | 10/2006 |
| JP | 2015-106674 | 6/2015 |
| JP | 2018-162351 | 10/2018 |

\* cited by examiner

SEMICONDUCTOR CHIP-ENCAPSULATING RESIN COMPOSITION CONTAINING EPOXY RESIN, AND SEMICONDUCTOR PACKAGE INCLUDING A CURED PRODUCT OF THE SEMICONDUCTOR-CHIP-ENCAPSULATING RESIN COMPOSITION

CROSS-REFERENCE TO RELATED APPLICATIONS

This application is a National Stage of International Application No. PCT/JP2018/040473 filed Oct. 31, 2018 claiming priority to Japanese Patent Application No. 2017-219228 filed Nov. 14, 2017 and Japanese Patent Application No. 2018-015698, filed Jan. 31, 2018, the contents of each of the applications are hereby incorporated by reference in their entirety.

TECHNICAL FIELD

The present disclosure generally relates to a semiconductor-chip-encapsulating resin composition and a semiconductor package. More particularly, the present disclosure relates to a semiconductor-chip-encapsulating resin composition containing an epoxy resin, and a semiconductor package including an encapsulation resin, which is a cured product of the semiconductor-chip-encapsulating resin composition.

BACKGROUND ART

Patent Literature 1 discloses a semiconductor-chip-encapsulating thermosetting resin composition. The thermosetting resin composition contains a thermosetting resin, a curing agent, and a colorant, which may be titanium black, for example.

CITATION LIST

Patent Literature

Patent Literature 1: JP H04-72360 A

SUMMARY OF INVENTION

It is an object of the present disclosure to provide a semiconductor-chip-encapsulating resin composition and a semiconductor package, which are able to not only blacken an encapsulation resin but also lower the dielectric loss tangent of the encapsulation resin.

Solution to Problem

A semiconductor-chip-encapsulating resin composition according to an aspect of the present disclosure contains: an epoxy resin; a curing agent; and a low-valent titanium oxide, of which a titanium atom has an oxidation number less than +IV.

A semiconductor package according to another aspect of the present disclosure includes: a semiconductor chip; and an encapsulation resin which covers the semiconductor chip and which is a cured product of the semiconductor-chip-encapsulating resin composition described above.

Advantageous Effects of Invention

The present disclosure provides a semiconductor-chip-encapsulating resin composition and a semiconductor package, which are able to not only blacken an encapsulation resin but also lower the dielectric loss tangent of the encapsulation resin.

DESCRIPTION OF EMBODIMENTS

1. Overview of Present Disclosure

A semiconductor package includes semiconductor chips such as transistors and ICs, and an encapsulation resin which is a cured product of a resin composition and which covers those semiconductor chips. Adding a black colorant to the resin composition may blacken the encapsulation resin. Examples of the black colorants include carbon black and titanium black. For example, Patent Literature 1 (JP H04-72360 A) mentioned above discloses a semiconductor-chip-encapsulating thermosetting resin composition, which contains a thermosetting resin, a curing agent, and a colorant and which uses titanium black as the colorant.

Recently, as increasing numbers of electronic devices come to have capabilities of operating at even higher speeds and even higher frequencies, there has been a growing demand for further speeding up semiconductor chips. To meet such a demand, semiconductor packages including semiconductor chips are increasingly required to improve their radio frequency characteristics. To improve the radio frequency characteristics of semiconductor packages, the relative dielectric constant and dielectric loss tangent of the encapsulation resin need to be lowered.

To allow an encapsulation resin containing titanium black as disclosed in Patent Literature 1 to have approximately the same degree of blackness as an encapsulation resin containing carbon black, then a lot of titanium black should be added thereto. In addition, an encapsulation resin containing titanium black as in Patent Literature 1 is unable to lower the dielectric loss tangent sufficiently.

To overcome this problem, the present inventors carried out research and development to provide a semiconductor-chip-encapsulating resin composition with the ability to not only blacken the encapsulation resin but also lower the dielectric loss tangent of the encapsulation resin. As a result, the present inventors acquired the basic idea of the present disclosure.

A semiconductor-chip-encapsulating resin composition according to an embodiment of the present disclosure (hereinafter simply referred to as "resin composition X") contains an epoxy resin, a curing agent, a curing accelerator, an inorganic filler, and a low-valent titanium oxide, of which a titanium atom has an oxidation number less than +IV.

Figure 1:
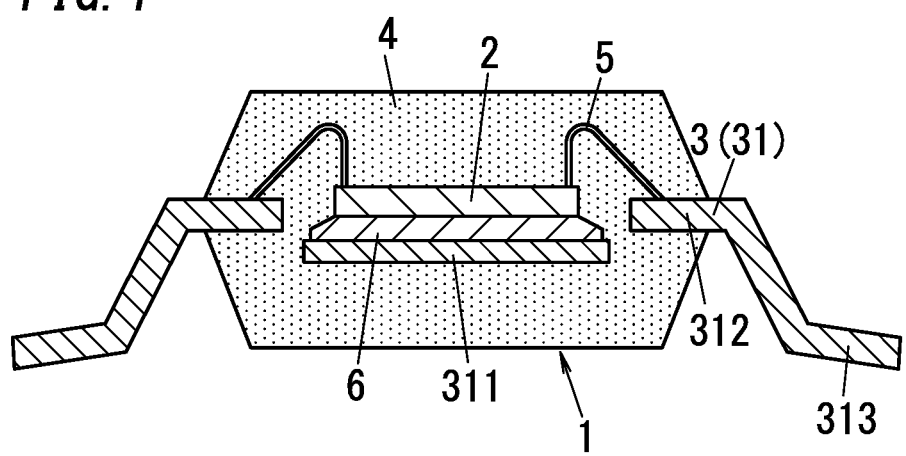
FIG. 1 is a schematic cross-sectional view of a semiconductor package according to a first example.
Figure 2A:
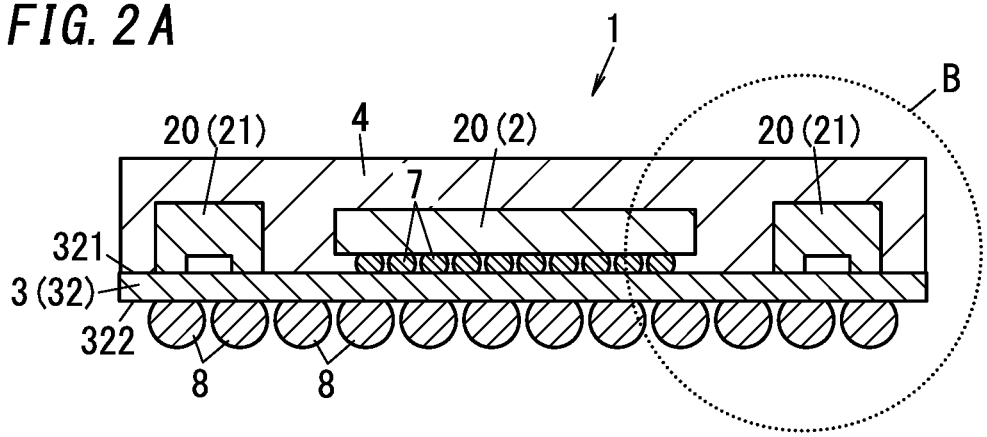
FIG. 2A is a schematic cross-sectional view of a semiconductor package according to a second example.
Figure 2B:
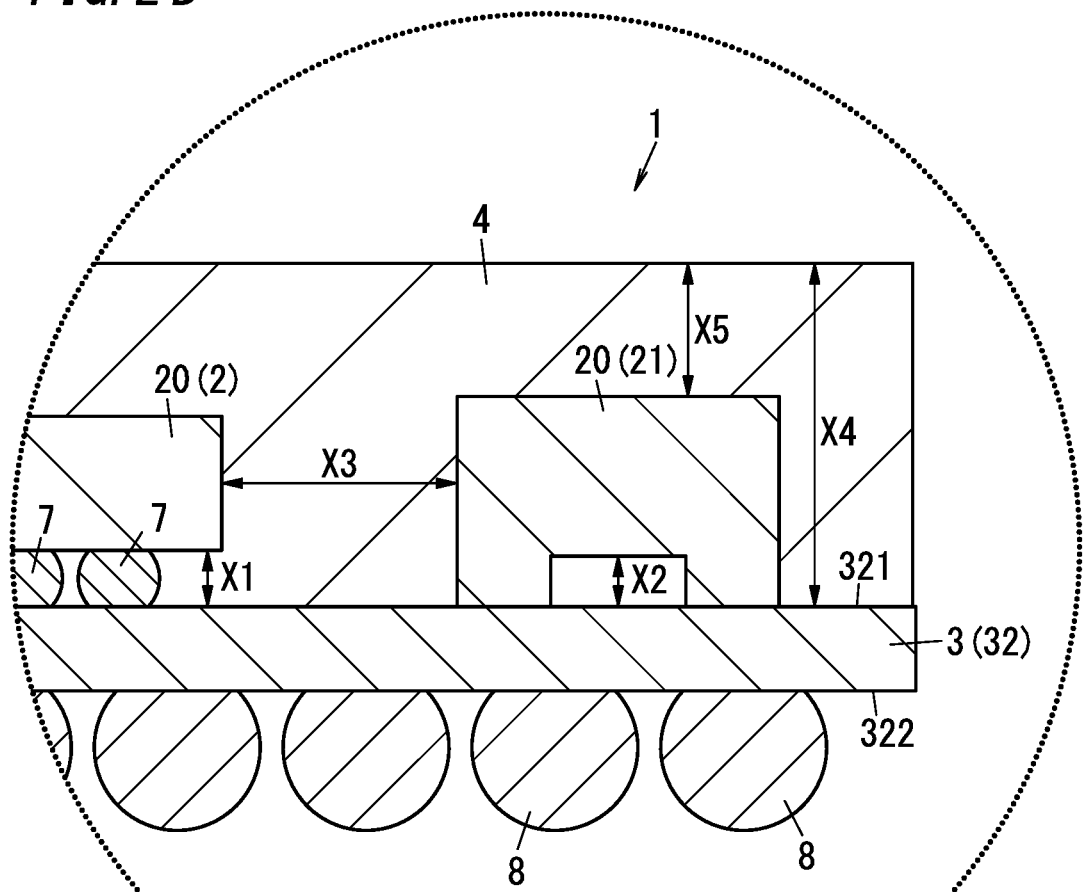
FIG. 2B is a schematic cross-sectional view illustrating, on a larger scale, a main part of the semiconductor package shown in FIG. 2A.

The resin composition X is suitable to make the encapsulation resin 4 of the semiconductor packages 1 shown in FIGS. 1, 2A, and 2B. For example, a method for fabricating the semiconductor package 1 may include making the encapsulation resin 4 by forming the resin composition X by pressure molding. This encapsulation resin 4 has been formed to cover the semiconductor chips 2. Thus, the semiconductor package 1 according to this embodiment includes semiconductor chips 2 and the encapsulation resin 4 that covers the semiconductor chips 2 and that is a cured product of the resin composition X. Also, the semiconductor package 1 according to this embodiment includes semiconductor chips 2 and the encapsulation resin 4 that covers the semiconductor chips 2 and that is a cured product of the resin composition X.

The titanium black is titanium oxynitride expressed by the formula TiO+TiN, and has a bluish black color. Meanwhile, the low-valent titanium oxide has a higher degree of blackness than titanium oxynitride. Supposing one encapsulation resin contains the low-valent titanium oxide, another encapsulation resin contains titanium oxynitride, and the content of the low-valent titanium oxide is equal to that of the titanium oxynitride, the encapsulation resin containing the low-valent titanium oxide is able to lower the dielectric loss tangent more significantly than the encapsulation resin containing the titanium oxynitride. Thus, adding the low-valent titanium oxide to the encapsulation resin allows the encapsulation resin to be blackened sufficiently and have its dielectric loss tangent lowered.

When an encapsulation resin made of the resin composition containing titanium oxynitride is irradiated with a laser beam such as a YAG laser beam, the titanium oxynitride is oxidized to discolor an irradiated region of the encapsulation resin. This allows marking to be left on the encapsulation resin. In this embodiment, when the encapsulation resin 4 made of the resin composition X is irradiated with a laser beam, the low-valent titanium oxide also comes to be oxidized to discolor an irradiated region of the encapsulation resin 4. The low-valent titanium oxide has a higher degree of blackness then the titanium oxynitride. Thus, in the encapsulation resin 4 made of the resin composition X according to this embodiment, the region discolored with the irradiation with the laser beam is more easily recognizable, compared to the case of containing titanium oxynitride as the black colorant. That is to say, according to this embodiment, the marking left is more easily recognizable than the case of using titanium oxynitride as the black colorant.

2. Semiconductor-Chip-Encapsulating Resin Composition

Next, the resin composition X will be described in further detail. As described above, the resin composition X contains an epoxy resin, a curing agent, and a low-valent titanium oxide. The semiconductor-chip-encapsulating resin composition may further contain a curing accelerator, an inorganic filler, and an oligomer having an indene structure.

2-1. Epoxy Resin

The epoxy resin is suitably in solid phase at an ordinary temperature. In particular, the epoxy resin is suitably in solid phase at any temperature falling within the range from 18° C. to 25° C.

The epoxy resin may contain at least one component selected from the group consisting of: glycidyl ether type epoxy resins; glycidyl amine type epoxy resins; glycidyl ester type epoxy resins; and olefin oxidized (alicyclic) epoxy resins. More specifically, the epoxy resin may contain one or more components selected from the group consisting of: alkyl phenol novolac type epoxy resins such as phenol novolac type epoxy resins and cresol novolac type epoxy resins; naphthol novolac type epoxy resins; phenol aralkyl type epoxy resins having a phenylene skeleton, a biphenylene skeleton, or any other skeleton; biphenyl aralkyl type epoxy resins; naphthol aralkyl type epoxy resins having a phenylene skeleton, a biphenylene skeleton, or any other skeleton; polyfunctional epoxy resins such as triphenolmethane type epoxy resins and alkyl-modified triphenolmethane type epoxy resins; triphenylmethane type epoxy resins; tetrakisphenol ethane type epoxy resins; dicyclopentadiene type epoxy resins; stilbene type epoxy resins; bisphenol type epoxy resins such as bisphenol A type epoxy resins and bisphenol F type epoxy resins; biphenyl type epoxy resins; naphthalene type epoxy resins; alicyclic epoxy resins; bromine-containing epoxy resins such as bisphenol A-type bromine-containing epoxy resins; glycidyl amine type epoxy resins obtained by reacting epichlorohydrin to polyamines such as diaminodiphenylmethane and isocyanuric acid; and glycidyl ester type epoxy resins obtained by reacting a polybasic acid such as phthalic acid or dimer acid to epichlorohydrin.

Among other things, the epoxy resin suitably contains one or more components selected from the group consisting of: bisphenol A type epoxy resins; phenol novolac type epoxy resins; cresol novolac type epoxy resins; biphenyl type epoxy resins; and triphenylphosphine type epoxy resins.

2-2. Curing Agent

The curing agent is used to cure the epoxy resin. The curing agent may contain, for example, one or more components selected from the group consisting of: phenolic compounds; acid anhydrides; and functional compounds to produce a phenolic hydroxyl group. Among other things, the curing agent suitably contains at least one of the phenolic compound or the functional compound. This imparts highly reliable humidity resistance to the encapsulation resin 4.

If the curing agent contains a phenolic compound, the curing agent may include any of a monomer, an oligomer, or a polymer, each of which has two or more phenolic hydroxyl groups per molecule. For example, the curing agent may contain one or more components selected from the group consisting of: phenol novolac resins; cresol novolac resins; biphenyl type novolac resins; triphenylmethane type resins; naphthol novolac resins; phenol aralkyl resins; and biphenyl aralkyl resins.

If the curing agent contains a phenolic compound, the hydroxyl group equivalent of the phenolic compound per epoxy group equivalent of the epoxy resin is suitably at least equal to 0.5, and more suitably 0.8 or more. The hydroxyl group equivalent is suitably at most equal to 2.0, and more suitably 1.4 or less.

If the curing agent contains an acid anhydride, then the curing agent may contain one or more components selected from the group consisting of: phthalic anhydride; trimellitic anhydride; pyromellitic anhydride; maleic anhydride; benzophenone tetracarboxylic acid; hexahydrophthalic anhydride; tetrahydrophthalic anhydride; methylhexahydrophthalic anhydride; methyl tetrahydrophthalic anhydride; and polyazelaic anhydrides. If the curing agent contains an acid anhydride, an acid anhydride of the epoxy resin per epoxy group equivalent is suitably at least equal to 0.7 eq., and is more suitably 0.8 eq. or more. The acid anhydride is suitably at most equal to 1.5 eq. and is more suitably 1.2 eq. or less.

If the curing agent contains a functional compound that generates a phenolic hydroxyl group, then the curing agent may contain a compound that generates the phenolic hydroxyl group by being heated. More specifically, the curing agent may contain a benzoxadine that has its ring cleaved open and generates a phenolic hydroxyl group when heated.

2-3. Low-Valent Titanium Oxide

The low-valent titanium oxide has a titanium atom, of which the oxidation number is less than +IV as described above. The low-valent titanium oxide is a titanium oxide expressed by the general formula $Ti_nO_{2n-1}$, where n is a number larger than 0.5 and at most equal to 10, and is suitably 5 or less, and even more suitably 2 or less. As a commercial low-valent titanium oxide, Tilack D (which is a name of a product manufactured by Ako Kasei Co., Ltd.) TM-F or TM-B (product number) is available, for example.

In this embodiment, the low-valent titanium oxide suitably has an L* value falling within the range from 9 to 14, an a* value falling within the range from −3.0 to 0.5, and a b* value falling within the range from −5.0 to −0.1. This facilitates blackening the encapsulation resin 4 and makes more easily recognizable the marking left by irradiating the encapsulation resin 4 with a laser beam. Also, compared to the case of using titanium oxynitride as the black colorant, using the low-valent titanium oxide as the black colorant reduces the amount of the black colorant required to make the degree of blackness of the encapsulation resin 4 a constant value.

The low-valent titanium oxide suitably has a mean particle size falling within the range from 0.2 μm to 2.0 μm, and more suitably has a mean particle size falling within the range from 0.4 μm to 1.5 μm. This improves both the degree of dispersivity of the low-valent titanium oxide in the encapsulation resin 4 and the chromogenicity of the color black in the encapsulation resin 4 alike. Note that the mean particle size is a volume-based median diameter to be calculated based on the measured values of a particle size distribution by laser diffraction and scattering method. The mean particle size may be obtained by a commercial laser diffraction and scattering particle size analyzer.

The content of the low-valent titanium oxide suitably accounts for 0.1 mass % to 7 mass %, and more suitably accounts for 0.3 mass % to 5 mass %, of the entire resin composition X. This facilitates blackening the encapsulation resin 4 and lowering the dielectric loss tangent of the encapsulation resin 4.

In addition, the total content of the low-valent titanium oxide and the inorganic filler (to be described later) suitably accounts for 80 mass % to 97 mass % of the entire resin composition X. In that case, the inorganic filler would decrease the linear expansivity of the encapsulation resin moderately, reduce the warp of the semiconductor package 1 during the reflow for example, and maintain good flowability for the resin composition X during molding.

2-4. Curing Accelerator

Any normal curing accelerator may be used as the curing accelerator as long as the curing accelerator may be added to the resin composition X. The curing accelerator may contain one or more components selected from the group consisting of: imidazoles; organic phosphines; and tertiary amines. Examples of the imidazoles include 2-methylimidazole and 2-phenylimidazole. Examples of the organic phosphines include triphenylphosphine, tributylphosphine, and trimethylphosphine. Examples of the tertiary amines include 1,8-diazabicyclo (5,4,0) undecene, triethanolamine, and benzyldimethylamine.

The content of the curing accelerator in the resin composition X suitably accounts for 0.1 mass % to 5 mass % of the total content of the epoxy resin and the curing agent. This would allow the curing agent to accelerate curing of the epoxy resin particularly significantly and allow the resin composition X to be cured particularly easily.

2-5. Inorganic Filler

The inorganic filler suitably contains metal oxide particles or silicon nitride. The metal oxide particles may contain at least one component selected from the group consisting of silica and alumina, for example. Adding the inorganic filler to the resin composition X allows the thermal expansion coefficient of the encapsulation resin 4 to be adjusted. The metal oxide particles suitably include silica, which has a small liner expansivity. Thus, adding silica to the resin composition X would reduce the warp of a substrate more easily when the encapsulation resin 4 made of the resin composition X is provided on one surface of the substrate. Examples of the silica include fused silica such as a fused spherical silica and a crystalline silica. The inorganic filler suitably contains a fused silica, among other things. This would achieve a high fill density of the inorganic filler in the resin composition X and high flowability of the resin composition X during molding. It is also recommended that the inorganic filler contain at least one component selected from the group consisting of alumina, crystalline silica, and silicon nitride. This would allow the encapsulation resin 4 to have high thermal conductivity.

The inorganic filler may have a mean particle size falling within the range from 0.2 μm to 70 μm, for example. This would achieve particularly good flowability when the resin composition X is molded. Optionally, the inorganic filler may contain two or more components with mutually different mean particle sizes to adjust the viscosity of the resin composition X and the physical properties of the encapsulation resin 4 during molding.

2-6. Oligomer Having Indene Structure

Adding an oligomer having an indene structure to the resin composition X would lower the hygroscopicity of the semiconductor-chip-encapsulating resin composition. This would lower the relative dielectric constant and dielectric loss tangent of the encapsulation resin.

The oligomer having the indene structure is suitably a copolymer of monomer components including, for example, indenes, styrenes, and phenols. The number average molecular weight of the oligomer having the indene structure suitably falls within the range from 300 to 1,000. The softening point of the oligomer having the indene structure suitably falls within the range from 50° C. to 160° C.

The indenes may contain one or more components selected from the group consisting of: indene; methyl indene; ethyl indene; propyl indene; and phenyl indene. Indenes suitably contain indene, in particular. Monomer components suitably contain 60 mass % or more of indenes.

The styrenes may contain one or more components selected from the group consisting of: styrene; o-methyl styrene; m-methyl styrene; p-methyl styrene; o-ethyl styrene; m-ethyl styrene; p-ethyl styrene; o-propyl styrene; m-propyl styrene; p-propyl styrene; alkyl-substituted styrenes such as o-n-butyl styrene; α-methyl styrene; α-ethyl styrene; and α-propyl styrene. The styrenes suitably contain styrene, in particular.

The phenols may contain one or more components selected from the group consisting of: alkylphenols such as phenols and cresols; di-alkyl phenols such as xylenol; naphthols; bisphenols such as bisphenol A and bisphenol F; and polyfunctional phenolic resins such as phenol novolac resins and phenol aralkyl resins. The phenols suitably contain phenol, among other things.

Optionally, the monomer components may contain some additional components other than the indenes, the styrenes, and the phenols. For example, the monomer components may contain one or more components selected from the group consisting of: benzothiophene; methyl benzothiophenes; benzofuran; methylbenzofurans; vinyl naphthalene; vinyl biphenyl; acenaphthylene; acrylic acid; acrylic acid esters; methacrylic acid; methacrylic acid esters; maleic anhydride; fumaric acid; divinyl benzenes: and diisopropenylbenzenes.

The oligomer having the indene structure may be produced by radical polymerization method, cation polymerization method, or anion polymerization method, whichever is appropriate. Among other things, the oligomer having the indene structure is suitably produced by cation polymerization method. That is to say, the oligomer having the indene structure is suitably produced by co-polymerization of monomer components including indenes, styrenes, and phenols by cation polymerization method.

The oligomer having the indene structure may have a structure expressed by the following Chemical Formula (I):

[Chemical Formula 1]

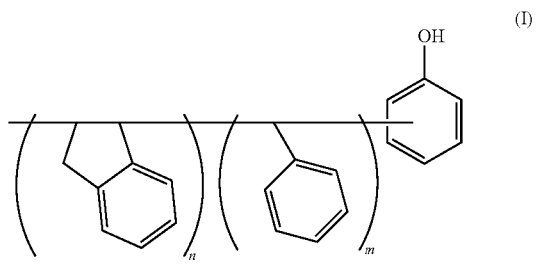

(I)

In Chemical Formula (I), m and n are positive integers, and the m and n values are determined by the respective structures and contents of the indenes, styrenes, and phenols contained in the monomer components.

Examples of commercially available products of the oligomer having the indene structure include products with the names I-100, I-120, IP-100, IP-120, and IS-100BT manufactured by Nippon Steel & Sumikin Materials Co., Ltd. Among other things, the resin composition X suitably includes, as the oligomer having the indene structure, at least one of the products with the names I-100 and IP-100, respectively, manufactured by Nippon Steel & Sumikin Materials Co., Ltd.

The ratio of the oligomer having the indene structure to the entire resin composition X suitably falls within the range from 0.5 mass % to 2.0 mass %, and more suitably falls within the range from 1.0 mass % to 2.0 mass %. This reduces not only the hygroscopicity of the resin composition X but also the dielectric loss tangent of the cured product of the resin composition X particularly significantly.

2-7. Additives

The resin composition X may contain some additives other than the components enumerated above unless the advantages of this embodiment are ruined significantly. Examples of the additives may include release agents, coupling agents, colorants, flame retardants, stress-reducing agents, and ion trapping agents.

The release agent may contain at least one component selected from the group consisting of: carnauba wax; stearic acid; montanic acid; carboxyl group-containing polyolefin; ester wax; polyethylene oxide; and metallic soaps.

The coupling agent may contain at least one component selected from the group consisting of: silane coupling agents; titanate coupling agents; aluminum coupling agents; and aluminum/zirconium coupling agents. The silane coupling agent may contain at least one component selected from the group consisting of glycidoxy silanes such as γ-glycidoxypropyltrimethoxysilane, γ-glycidoxypropylm-ethyldiethoxysilane, and β-(3,4-epoxy cyclohexyl) ethyltrimethoxysilane; amino silanes such as N-β (amino ethyl)-γ-aminopropyltrimethoxysilane, γ-aminopropyltriethoxysilane, and N-phenyl-γ-amino propyltrimethoxysilane; alkyl silane; ureido silane; and vinyl silane.

If the inorganic filler in the resin composition X contains not only metal oxide particles but also a resin composition X coupling agent, then the ratio of the coupling agent to the metal oxide particles suitably falls within the range from 0.01 wt % to 1 wt %, and more suitably falls within the range from 0.2 wt % to 1 wt %. This facilitates reducing the relative dielectric constant and dielectric loss tangent of an encapsulation resin made of the semiconductor-chip-encapsulating resin composition.

The flame retardant may contain at least one component selected from the group consisting of: magnesium hydroxide; aluminum hydroxide; and red phosphorus.

The colorant may contain at least one component selected from the group consisting of: carbon black; red iron oxide; titanium oxide; phthalocyanine; and perylene black.

The stress-reducing agent may contain at least one component selected from the group consisting of: silicone elastomers; silicone resins; silicone oils; and butadiene rubber. The butadiene rubber may contain at least one component selected from the group consisting of a methyl acrylate-butadiene-styrene copolymer and a methyl methacrylate-butadiene-styrene copolymer.

The ion trapping agent may contain at least one of a hydrotalcite compound or a hydrous oxide of a metallic element. The hydrous oxide of a metallic element may contain at least one component selected from the group consisting of: hydrous oxides of aluminum; hydrous oxides of bismuth; hydrous oxides of titanium; and hydrous oxides of zirconium.

2-8. Method for Manufacturing Semiconductor-Chip-Encapsulating Resin Composition Next, a method for manufacturing a resin composition X will be described. The resin composition X may be manufactured by kneading its materials while heating them. More specifically, the resin composition X may be obtained by mixing, using a mixer, a blender, or any other machine, materials including an epoxy resin, a curing agent, a curing accelerator, an inorganic filler, a low-valent titanium oxide, and a desired additive together, kneading and heating the mixture of these materials using a kneading machine such as a heat roller or a kneader, and then cooling the resultant mixture to room temperature. Optionally, a powder may be obtained by pulverizing the resin composition X. Alternatively, tablets may be obtained by pulverizing the resin composition X into a powder and then tableting the resultant power.

3. Semiconductor Package (Semiconductor Package According to First Example)

Next, a semiconductor package according to a first example including an encapsulation resin 4 as a cured product of the resin composition X will be described with reference to FIG. 1. Note that the configuration shown in FIG. 1 is only an exemplary configuration for the semiconductor package 1 and should not be construed as limiting.

Examples of the semiconductor package 1 include insert type packages such as Mini, D pack, D2 pack, To22O, To3P, and dual in-line package (DIP) and surface-mount packages such as quad flat package (QFP), small outline package (SOP), small outline J lead package (SOJ), and ball grid array (BGA). A semiconductor package 1 may be implemented as a system-on-chip (SOC) or a system-in-package (SiP) as well.

The semiconductor package 1 may include a substrate 3, a semiconductor chip 2 mounted on the substrate 3, and an encapsulation resin 4 that covers the semiconductor chip 2. The encapsulation resin 4 defines the shape of the semiconductor package 1 and may be made of a cured product of the resin composition X. The semiconductor chip 2 may be an integrated circuit, a largescale integrated circuit, a transistor, thyristor, a diode, or a solid-state image sensor, for example. The semiconductor chip 2 may also be a novel power device such as an SiC semiconductor device or a GaN semiconductor device. The substrate 3 may be implemented as either a lead frame or a wiring board.

The substrate 3 of the semiconductor package 1 shown in FIG. 1 is implemented as a lead frame 31. The semiconductor package 1 shown in FIG. 1 includes a metallic lead frame 31, the semiconductor chip 2 mounted on the lead frame 31, a plurality of wires 5 that electrically connect the semiconductor chip 2 to the lead frame 31, and an encapsulation resin 4 that covers the semiconductor chip 2.

The lead frame 31 includes a die pad 311, inner leads 312, and outer leads 313. The lead frame 31 may be made of an iron alloy such as 42 alloy or a metallic material including copper as a main component.

To manufacture the semiconductor package 1 shown in FIG. 1, the semiconductor chip 2 may be fixed, for example, with an appropriate die-bonding material 6 onto the die pad 311 of the lead frame 31, thereby mounting the semiconductor chip 2 onto the lead frame 31. Next, electrode pads (not shown) of the semiconductor chip 2 and the inner leads 312 of the lead frame 31 are connected together with the wires 5. The wires 5 may be made of gold but may include at least one of silver or copper. Subsequently, the encapsulation resin 4 is formed by molding and curing the resin composition X around the semiconductor chip 2. Thereafter, the encapsulation resin 4 is irradiated with a laser beam such as a YAG laser beam, thereby oxidizing and whitening the low-valent titanium oxide included in the encapsulation resin 4 and marking the encapsulation resin 4.

The encapsulation resin 4 is suitably formed by molding the resin composition X by pressure molding. Examples of the pressure molding include an injection molding, a transfer molding, and a compression molding.

In the semiconductor package 1 according to the first example, the encapsulation resin 4 suitably has a relative dielectric constant falling within the range from 3.3 to 3.6. In addition, the encapsulation resin 4 of the semiconductor package 1 suitably has a dielectric loss tangent falling within the range from 0.003 to 0.015, more suitably within the range from 0.003 to 0.008, and even more suitably within the range from 0.003 to 0.007. This allows the semiconductor package 1 to exhibit good radio frequency characteristics.

(Semiconductor Package According to Second Example)

Next, a semiconductor package according to a second example including an encapsulation resin 4 as a cured product of the resin composition X will be described with reference to FIGS. 2A and 2B. Note that the configuration shown in FIGS. 2A and 2B is only an exemplary configuration for the semiconductor package 1 and should not be construed as limiting.

As shown in FIGS. 2A and 2B, in the semiconductor package 1 according to the second example, a plurality of electronic components 20, including the semiconductor chip 2, are mounted on a substrate 3 and are encapsulated on a single side with the same encapsulation resin 4. That is to say, the semiconductor package 1 according to the second example is a single-side encapsulated package. The semiconductor package 1 shown in FIGS. 2A and 2B is a ball grid array (BGA), which is a type of surface-mount package, and is also a system-in-package (SiP). A configuration for the semiconductor package 1 according to the second example will be described in detail.

The semiconductor package 1 according to the second example includes the substrate 3, the plurality of electronic components 20, a plurality of bump electrodes 7, another plurality of bump electrodes 8, and the encapsulation resin 4.

The substrate 3 according to the second example is a wiring board 32. On a mounting surface 321, which is one surface of the wiring board 32, mounted are the plurality of electronic components 20. On the other surface 322, opposite from the mounting surface 321, of the wiring board 32, provided are the plurality of bump electrodes 8.

The plurality of electronic components 20 are mounted on the mounting surface 321 of the wiring board 32 as described above. At least one of the plurality of electronic components 20 is the semiconductor chip 2. The semiconductor chip 2 may be a bare chip or a package, whichever is appropriate. The semiconductor chip 2 may be the same as the semiconductor chip 2 according to the first example. The semiconductor chip 2 includes the plurality of bump electrodes 7, via which the semiconductor chip 2 is electrically connected to the wiring board 32. The gap between the semiconductor chip 2 and the wiring board 32 (the dimension X1 shown in FIG. 2B) may fall within the range from 20 μm to 50 μm, for example. Although the semiconductor package 1 according to the second example includes only one semiconductor chip 2, the semiconductor package 1 may include two or more semiconductor chips 2 as well.

The plurality of electronic components 20 includes at least one inductor 21, for example. The inductor 21 and the wiring board 32 are electrically connected together. The gap between the inductor 21 and the wiring board 32 (i.e., the dimension X2 shown in FIG. 2B) may fall within the range from 10 μm to 50 μm. The interval between the inductor 21 and the semiconductor chip 2 (i.e., the dimension X3 shown in FIG. 2B) may fall within the range from 0.1 μm to several μm. Although the semiconductor package 1 according to the second example includes two inductors 21, the semiconductor package 1 may include only one inductor 21 or three or more inductors 21 as well. Optionally, the electronic components 20 may include not only the semiconductor chip 2 and the inductors 21 but also other types of electronic components as well.

The encapsulation resin 4 is a cured product of the resin composition X. The encapsulation resin 4 covers the semiconductor chip 2 on the mounting surface 321 of the substrate 3 (i.e., the wiring board 32). The encapsulation resin 4 also covers the plurality of electronic components 20. That is to say, the encapsulation resin 4 encapsulates the single side of the substrate 3. The encapsulation resin 4 that covers the mounting surface 321 may have a thickness (i.e., the dimension X4 shown in FIG. 2B) falling within the range from 100 μm to 500 μm. The encapsulation resin 4 that covers the electronic components 20 (including the semiconductor chip 2 and the inductors 21) has a thickness (i.e., the dimension X5 shown in FIG. 2B) falling within the range from 10 μm to 100 μm, for example. The gap between the wiring board 32 and the semiconductor chip 2 is filled with the encapsulation resin 4. The gap between the wiring board 32 and each of the inductors 21 is also filled with the encapsulation resin 4.

To manufacture the semiconductor package 1 according to the second example, the plurality of electronic components 20 are mounted on the mounting surface 321 of the wiring board 32 and then the resin composition X is molded and cured to cover the mounting surface 321, thereby forming the encapsulation resin 4. The resin composition X may be molded by transfer molding or compression molding, for example. In that case, the encapsulation resin 4 not only covers the surface of the semiconductor chip 2 and the inductors 21 but also fills the gap between the semiconductor chip 2 and the wiring board 32 and the gap between each of the inductors 21 and the wiring board 32 as well. Furthermore, the encapsulation resin 4 is irradiated with a laser beam such as a YAG laser beam, thereby oxidizing and whitening the low-valent titanium oxide included in the encapsulation resin 4 and marking the encapsulation resin 4.

In the semiconductor package 1 according to the second example, the encapsulation resin 4 also suitably has a relative dielectric constant falling within the range from 3.3 to 3.6. In addition, the encapsulation resin 4 of the semiconductor package 1 according to the second example also suitably has a dielectric loss tangent falling within the range from 0.003 to 0.015, more suitably within the range from 0.003 to 0.008, and even more suitably within the range from 0.003 to 0.007. This allows the semiconductor package 1 to exhibit good radio frequency characteristics.

EXAMPLES

Next, the present disclosure will be described specifically by way of illustrative examples. Note that the specific examples to be described below are only examples of the present disclosure and should not be construed as limiting.

(1) Preparing Semiconductor-Chip-Encapsulating Resin Composition

In each of specific examples and comparative examples, the components shown in Tables 1-3 were uniformly mixed and dispersed with a mixer, kneaded with a kneader while being heated, cooled, and then pulverized, thereby obtaining a powder of a semiconductor-chip-encapsulating resin composition.

The following are the details of the components shown in Tables 1-3:

Epoxy resin #1: biphenyl aralkyl type epoxy resin, manufactured by Nippon Kayaku Co., Ltd., product number NC3000 (eq 276);

Epoxy resin #2: biphenyl type epoxy resin, manufactured by Mitsubishi Chemical Corporation, product number YX4000H (eq. 195);

Curing agent: phenol curing agent, manufactured by Meiwa Plastic Industries, Ltd., product number DL92 (eq. 105);

Curing accelerator: triphenyl phosphine, manufactured by Hokko Chemical Industry, product number TPP;

Inorganic filler: spherical fused silica, manufactured by Denka Company Ltd., product number FB940;

Low-valent titanium oxide #1: product name Tilack D, manufactured by Ako Kasei Co., Ltd., product number TM-F (with an $L^*$ value of 10.44, an $a^*$ value of 0.36, a $b^*$ value of −0.35, and an mean particle size of 0.4 μm);

Low-valent titanium oxide #2: product name Tilack D, manufactured by Ako Kasei Co., Ltd., product number TM-B (with an $L^*$ value of 12.88, an $a^*$ value of −1.50, a $b^*$ value of −3.99, and a mean particle size of 0.7 μm);

Colorant #1 (carbon black): manufactured by Mitsubishi Chemical Corporation, product number MA600 (with a mean particle size of 0.20 μm);

Colorant #2 (titanium oxynitride): manufactured by Mitsubishi Chemical Corporation, product number 13M-T (with an $L^*$ value of 9.5 and a mean particle size of 0.67 μm);

Indene oligomer #1: manufactured by Nippon Steel & Sumikin Materials Co., Ltd., product name I-100;

Indene oligomer #2: manufactured by Nippon Steel & Sumikin Materials Co., Ltd., product name IP-100;

Release agent: polyethylene wax, manufactured by Dainichi Chemical Industry Co., Ltd., product number PE-A; and Coupling agent: 3-mercaptopropyltrimethoxysilane, manufactured by Shin-Etsu Chemical Co., Ltd., product number KBM803.

(2) Making Cured Product

Powders of the semiconductor-chip-encapsulating resin compositions according to first to twentieth examples and first to fourth comparative examples were transfer-molded under the condition including a molding pressure of 3.9 MPa, a temperature of 175° C., and a molding duration of 120 seconds. Thereafter, the powders were subjected to post-mold curing under the condition including a temperature of 175° C. and a molding duration of four hours, thereby making a cured product of a semiconductor-chip-encapsulating resin composition.

(3) Evaluation (3-i) Degree of Blackness

The degrees of blackness (L values) of the cured products of the first to twentieth specific examples and the first to fourth comparative examples were measured with a colorimeter (manufactured by Tokyo Denshoku Co., Ltd., model number SP-80). The degrees of blackness thus measured were rated under the following criteria:

A: having a degree of blackness of 11 or more;

B: having a degree of blackness falling within the range from 9 to 10; or

C: having a degree of blackness of 8 or less.

(3-ii) Measuring Relative Dielectric Constant and Dielectric Loss Tangent

The respective cured products of the first to twentieth specific examples and the first to fourth comparative examples were machined into molded products with dimensions of 1.5 mm×1.5 mm×85 mm. The relative dielectric constants and dielectric loss tangents of the molded products at 10 GHz were measured with a network analyzer (manufactured by Agilent Technologies, model number N5230A).

(3-iii) Recognizability of YAG Laser Marks

The cured products of the first to twentieth examples and the first to fourth comparative examples were irradiated with a laser beam emitted from a YAG laser diode (manufactured by NEC Corporation, product number SL475K-0181) to mark the cured products. Then, the marks thus printed had their recognizability rated under the following criteria:

A: marks easily recognizable with the naked eyes;

B: marks difficult to recognize with the naked eyes; or

C: marks unrecognizable with the naked eyes.

TABLE 1

| | Examples | | | | | | | | | |
|---|---|---|---|---|---|---|---|---|---|---|
| | 1 | 2 | 3 | 4 | 5 | 6 | 7 | 8 | 9 | 10 |
| Epoxy resin #1 | 90.71 | 90.71 | 91.43 | 91.43 | 87.84 | 87.84 | 94.29 | 59.17 | — | 83.54 |
| Epoxy resin #2 | — | — | — | — | — | — | — | — | 80.76 | — |
| Curing agent | 33.54 | 33.54 | 33.80 | 33.80 | 32.48 | 32.48 | 35.00 | 21.20 | 43.49 | 30.89 |
| Curing accelerator | 2.29 | 2.29 | 2.31 | 2.31 | 2.22 | 2.22 | 2.22 | 2.10 | 2.29 | 2.11 |
| Inorganic filler | 860.00 | 860.00 | 860.00 | 860.00 | 860.00 | 860.00 | 860.00 | 860.00 | 860.00 | 860.00 |
| Low-valent titanium oxide #1 | 5.00 | — | 5.00 | — | 10.00 | — | 1.00 | 50.00 | 5.00 | 5.00 |
| Low-valent titanium oxide #2 | — | 5.00 | — | 5.00 | — | 10.00 | — | — | — | — |
| Colorant #1 (carbon black) | 1.00 | 1.00 | — | — | — | — | — | — | 1.00 | 1.00 |
| Colorant #2 (titanium oxynitride) | — | — | — | — | — | — | — | — | — | — |
| Indene oligomer #1 | — | — | — | — | — | — | — | — | — | 10.00 |
| Indene oligomer #2 | — | — | — | — | — | — | — | — | — | — |
| Release agent | 3.00 | 3.00 | 3.00 | 3.00 | 3.00 | 3.00 | 3.00 | 3.00 | 3.00 | 3.00 |
| Coupling agent | 4.50 | 4.50 | 4.50 | 4.50 | 4.50 | 4.50 | 4.50 | 4.50 | 4.50 | 4.50 |
| Total | 1000.0 | 1000.0 | 1000.0 | 1000.0 | 1000.0 | 1000.0 | 1000.0 | 1000.0 | 1000.0 | 1000.0 |
| Evaluation Degree of blackness | A | A | C | C | B | A | C | A | A | B |
| Dielectric loss tangent | 0.007 | 0.007 | 0.006 | 0.006 | 0.006 | 0.006 | 0.006 | 0.005 | 0.007 | 0.005 |
| Relative dielectric constant | 3.5 | 3.5 | 3.6 | 3.6 | 3.6 | 3.6 | 3.8 | 3.7 | 3.6 | 3.5 |
| Recognizability of YAG laser marks | A | A | B | B | A | A | C | A | A | A |

TABLE 2

| | Examples | | | | | | | | | |
|---|---|---|---|---|---|---|---|---|---|---|
| | 11 | 12 | 13 | 14 | 15 | 16 | 17 | 18 | 19 | 20 |
| Epoxy resin #1 | 83.54 | 76.37 | 76.37 | 73.50 | 74.80 | 89.03 | 91.96 | 76.21 | 77.73 | 93.15 |
| Epoxy resin #2 | — | — | — | — | — | — | — | — | — | — |
| Curing agent | 30.89 | 28.24 | 28.24 | 27.18 | 28.46 | 33.87 | 34.98 | 28.99 | 29.57 | 35.44 |
| Curing accelerator | 2.11 | 1.93 | 1.93 | 1.86 | 1.90 | 2.27 | 2.34 | 1.94 | 1.98 | 2.37 |
| Inorganic filler | 860.00 | 860.00 | 860.00 | 860.00 | 860.00 | 860.00 | 860.00 | 860.00 | 860.00 | 860.00 |
| Low-valent titanium oxide #1 | 5.00 | 5.00 | 5.00 | 10.00 | 5.00 | 5.00 | 5.00 | 5.00 | 5.00 | 5.00 |
| Low-valent titanium oxide #2 | — | — | — | — | — | — | — | — | — | — |
| Colorant #1 (carbon black) | 1.00 | 1.00 | 1.00 | — | 1.00 | 1.00 | 1.00 | 1.00 | 1.00 | 1.00 |
| Colorant #2 (titanium oxynitride) | — | — | — | — | — | — | — | — | — | — |
| Indene oligomer #1 | — | 20.00 | — | 20.00 | 20.00 | — | — | 20.00 | 20.00 | — |
| Indene oligomer #2 | 10.00 | — | 20.00 | — | — | — | — | — | — | — |
| Release agent | 3.00 | 3.00 | 3.00 | 3.00 | 3.00 | 3.00 | 3.00 | 3.00 | 3.00 | 3.00 |
| Coupling agent | 4.50 | 4.50 | 4.50 | 4.50 | 5.80 | 5.80 | 1.70 | 3.90 | 1.70 | 0.004 |
| Total | 1000.0 | 1000.0 | 1000.0 | 1000.0 | 1000.0 | 1000.0 | 1000.0 | 1000.0 | 1000.0 | 1000.0 |
| Evaluation Degree of blackness | B | B | B | B | B | A | A | B | B | A |
| Dielectric loss tangent | 0.005 | 0.005 | 0.005 | 0.005 | 0.004 | 0.007 | 0.008 | 0.007 | 0.007 | 0.008 |
| Relative dielectric constant | 3.5 | 3.4 | 3.4 | 3.4 | 3.4 | 3.5 | 3.5 | 3.5 | 3.5 | 3.5 |
| Recognizability of YAG laser marks | A | A | A | A | A | A | A | A | A | A |

TABLE 3

| | Comparative Examples | | | |
|---|---|---|---|---|
| | 1 | 2 | 3 | 4 |
| Epoxy resin #1 | 93.58 | 90.71 | 87.84 | 95.01 |
| Epoxy resin #2 | — | — | — | — |
| Curing agent | 34.60 | 33.54 | 32.48 | 35.13 |
| Curing accelerator | 2.36 | 2.29 | 2.22 | 2.40 |
| Inorganic filler | 860.00 | 860.00 | 860.00 | 860.00 |
| Low-valent titanium oxide #1 | — | — | — | — |
| Low-valent titanium oxide #2 | — | — | — | — |
| Colorant #1 (carbon black) | 2.00 | 1.00 | — | — |
| Colorant #2 (titanium oxynitride) | — | 5.00 | 10.00 | — |

TABLE 3-continued

|  |  | Comparative Examples | | | |
|---|---|---|---|---|---|
|  |  | 1 | 2 | 3 | 4 |
| Indene oligomer #1 | | — | — | — | — |
| Indene oligomer #2 | | — | — | — | — |
| Release agent | | 3.00 | 3.00 | 3.00 | 3.00 |
| Coupling agent | | 4.50 | 4.50 | 4.50 | 4.50 |
| Total | | 1000.0 | 1000.0 | 1000.0 | 1000.0 |
| Evaluation | Degree of blackness | A | C | C | C |
| | Dielectric loss tangent | 0.015 | 0.012 | 0.010 | 0.009 |
| | Relative dielectric constant | 3.7 | 3.6 | 3.6 | 3.5 |
| | Recognizability of YAG laser marks | A | B | C | C |

(Analysis)

Each of the cured products of the first to twentieth specific examples containing a low-valent titanium oxide as the black colorant had a lower dielectric loss tangent than the cured product of the first comparative example containing carbon black as the only black colorant, the cured products of the second and third comparative examples each containing titanium oxynitride as the black colorant, or the cured product of the fourth comparative example containing no black colorants. Each of the cured products of the first to eighth specific examples and the tenth to fourteenth specific examples contained a different type of epoxy resin from the cured product of the ninth specific example. Nevertheless, the cured product of each of these specific examples still had a low dielectric loss tangent.

Also, each of the cured products of the first and second specific examples contained a low-valent titanium oxide, of which the content was equal to that of the titanium oxynitride contained in the cured product of the second comparative example. Still, each of the cured products of the first and second specific examples had a higher degree of blackness, exhibited a higher degree of recognizability of YAG laser marks, and a lower dielectric loss tangent, than the cured product of the second comparative example.

Furthermore, each of the cured products of the third, fourth, and seventh specific examples contained a low-valent titanium oxide, of which the content was less than that of the titanium oxynitride contained in the cured product of the third comparative example. Nevertheless, each of the cured products of the third, fourth, and seventh specific examples exhibited almost the same degree of blackness as, and had a lower dielectric loss tangent than, the cured product of the third comparative example.

Furthermore, each of the cured products of the fifth and sixth specific examples contained a low-valent titanium oxide, of which the content was equal to that of the titanium oxynitride contained in the cured product of the third comparative example. Still, each of the cured products of the fifth and sixth specific examples had a higher degree of blackness, exhibited a higher degree of recognizability of YAG laser marks, and a lower dielectric loss tangent, than the cured product of the third comparative example.

That is to say, adding a low-valent titanium oxide as the black colorant blackens the cured product and lowers the dielectric loss tangent thereof at the same time.

Furthermore, each of the cured products of the tenth to fifteenth specific examples contained an oligomer having an indene structure, and therefore, had a lower dielectric loss tangent than any of the cured products of the first to seventh specific examples containing no oligomers having the indene structure.

Furthermore, the cured product of the sixteenth specific example had a larger ratio of the coupling agent to the inorganic filler than, and exhibited a lower dielectric loss tangent than, any of the cured products of the seventeenth and twentieth specific examples. Likewise, the cured product of the fifteenth specific example had a larger ratio of the coupling agent to the inorganic filler than, and exhibited a lower dielectric loss tangent and a lower relative dielectric constant than, any of the cured products of the eighteenth and nineteenth specific examples.

As can be seen from the foregoing description of embodiments, a semiconductor-chip-encapsulating resin composition according to a first aspect of the present disclosure contains: an epoxy resin; a curing agent; and a low-valent titanium oxide, of which a titanium atom has an oxidation number less than +IV.

The first aspect sufficiently blackens an encapsulation resin made of the semiconductor-chip-encapsulating resin composition and also lowers the dielectric loss tangent of the encapsulation resin. In addition, when irradiated with a laser beam, an encapsulation resin made of the semiconductor-chip-encapsulating resin composition comes to have a discolored portion which is more easily recognizable than in a situation where titanium oxynitride is contained as the black colorant. That is to say, this makes the marking more easily recognizable.

In a semiconductor-chip-encapsulating resin composition according to a second aspect of the present disclosure, which may be implemented in conjunction with the first aspect, the low-valent titanium oxide has: an L* value falling within a range from 9 to 14; an a* value falling within a range from −3.0 to 0.5; and a b* value falling within a range from −5.0 to −0.1.

The second aspect facilitates blackening an encapsulation resin made of the semiconductor-chip-encapsulating resin composition and makes the marking formed by irradiating the encapsulation resin with a laser beam more easily recognizable. In addition, comparing to using titanium oxynitride as the black colorant, using a low-valent titanium oxide as the black colorant reduces the amount of the black colorant that needs to be used to make the degree of blackness of the encapsulation resin constant.

In a semiconductor-chip-encapsulating resin composition according to a third aspect of the present disclosure, which may be implemented in conjunction with the first or second aspect, the low-valent titanium oxide has a mean particle size falling within a range from 0.2 μm to 2.0 μm.

The third aspect improves both the degree of dispersivity of the low-valent titanium oxide in an encapsulation resin made of the semiconductor-chip-encapsulating resin composition and the chromogenicity of the color black in the encapsulation resin.

In a semiconductor-chip-encapsulating resin composition according to a fourth aspect of the present disclosure, which may be implemented in conjunction with any one of the first to third aspects, a content of the low-valent titanium oxide falls within a range from 0.1 mass % to 7 mass %.

The fourth aspect facilitates blackening an encapsulation resin made of the semiconductor-chip-encapsulating resin composition and lowering the dielectric loss tangent of the encapsulation resin.

A semiconductor-chip-encapsulating resin composition according to a fifth aspect of the present disclosure, which may be implemented in conjunction with any one of the first to fourth aspects, contains 0.5 mass % to 2.0 mass % of an oligomer having an indene structure.

The fifth aspect particularly significantly reduces not only the hygroscopicity of the semiconductor-chip-encapsulating resin composition but also the dielectric loss tangent of a cured product of the semiconductor-chip-encapsulating resin composition.

A semiconductor-chip-encapsulating resin composition according to a sixth aspect of the present disclosure, which may be implemented in conjunction with any one of the first to fifth aspects, further contains an inorganic filler including metal oxide particles and a coupling agent. A ratio of the coupling agent to the metal oxide particles falls within a range from 0.01 wt % to 1 wt %.

The sixth aspect allows an OH group present on the surface of metal oxide particles and the coupling agent to react with each other efficiently, thus facilitating reduction of the relative dielectric constant and dielectric loss tangent of an encapsulation resin made of the semiconductor-chip-encapsulating resin composition.

In a semiconductor-chip-encapsulating resin composition according to a seventh aspect of the present disclosure, which may be implemented in conjunction with the sixth aspect, the metal oxide particle contains silica.

According to the seventh aspect, adding silica, which has a small linear expansivity, to the semiconductor-chip-encapsulating resin composition reduces the warp of a substrate more easily, when an encapsulation resin made of the semiconductor-chip-encapsulating resin composition is provided on one surface of the substrate.

A semiconductor package (1) according to an eighth aspect of the present disclosure includes: a semiconductor chip (2); and an encapsulation resin (4) which covers the semiconductor chip (2) and which is a cured product of the semiconductor-chip-encapsulating resin composition according to any one of the first to seventh aspects.

The eighth aspect provides a semiconductor package (1), of which the encapsulation resin (4) is blackened sufficiently and has a sufficiently low dielectric loss tangent. In addition, the eighth aspect also provides a semiconductor package (1), of which the marks left by irradiating the encapsulation resin (4) with a laser beam are easily recognizable.

A semiconductor package (1) according to a ninth aspect of the present disclosure, which may be implemented in conjunction with the eighth aspect, further includes a substrate (3). The semiconductor chip (2) is mounted on a mounting surface (321), which is one of surfaces of the substrate (3). The encapsulation resin (4) covers the semiconductor chip (2) on the mounting surface (321) of the substrate (3).

The ninth aspect provides a semiconductor package (1), of which the encapsulation resin (4) is blackened sufficiently and has a sufficiently low dielectric loss tangent. In addition, the ninth aspect also provides a semiconductor package (1), of which the marks left by irradiating the encapsulation resin (4) with a laser beam are easily recognizable.

In a semiconductor package (1) according to a tenth aspect of the present disclosure, which may be implemented in conjunction with the eighth or ninth aspect, the encapsulation resin (4) has marking.

The tenth aspect makes the marking easily recognizable because the encapsulation resin (4) has been blackened sufficiently.

REFERENCE SIGNS LIST

1 Semiconductor Package
2 Semiconductor Chip
3 Substrate
321 Mounting Surface
4 Encapsulation Resin

The invention claimed is:

1. A semiconductor-chip-encapsulating resin composition comprising:
    an epoxy resin;
    a curing agent; and
    a low-valent titanium oxide, of which a titanium atom has an oxidation number less than +IV, wherein the low-valent titanium oxide has a mean particle size falling within a range from 0.2 μm to 2.0 μm.

2. The semiconductor-chip-encapsulating resin composition of claim 1, wherein the low-valent titanium oxide has:
    an L* value falling within a range from 9 to 14;
    an a* value falling within a range from −3.0 to 0.5; and
    a b* value falling within a range from −5.0 to −0.1.

3. The semiconductor-chip-encapsulating resin composition of claim 1, wherein
    a content of the low-valent titanium oxide falls within a range from 0.1 mass % to 7 mass %.

4. The semiconductor-chip-encapsulating resin composition of claim 1, wherein
    the resin composition contains 0.5 mass % to 2.0 mass % of an oligomer having an indene structure.

5. The semiconductor-chip-encapsulating resin composition of claim 1, wherein
    the resin composition further contains an inorganic filler including metal oxide particles and a coupling agent, and
    a ratio of the coupling agent to the metal oxide particles falls within a range from 0.01 wt % to 1 wt %.

6. The semiconductor-chip-encapsulating resin composition of claim 5, wherein
    the metal oxide particle contains silica.

7. A semiconductor package comprising:
    a semiconductor chip; and
    an encapsulation resin which covers the semiconductor chip and which is a cured product of the semiconductor-chip-encapsulating resin composition of claim 1.

8. The semiconductor package of claim 7, further comprising a substrate, wherein
    the semiconductor chip is mounted on a mounting surface, which is one of surfaces of the substrate, and
    the encapsulation resin covers the semiconductor chip on the mounting surface of the substrate.

9. The semiconductor package of claim 7, wherein the encapsulation resin has marking.

* * * * *